(12) United States Patent
Kirsch

(10) Patent No.: US 7,277,160 B2
(45) Date of Patent: Oct. 2, 2007

(54) METHOD FOR AUTOMATICALLY PROVIDING DATA FOR THE FOCUS MONITORING OF A LITHOGRAPHIC PROCESS

(75) Inventor: Markus Kirsch, Reston, VA (US)

(73) Assignee: Vistec Semiconductor Systems GmbH, Weilburg (DE)

( * ) Notice: Subject to any disclaimer, the term of this patent is extended or adjusted under 35 U.S.C. 154(b) by 116 days.

(21) Appl. No.: 11/057,331

(22) Filed: Feb. 11, 2005

(65) Prior Publication Data

US 2006/0181693 A1    Aug. 17, 2006

(51) Int. Cl.
*G03B 27/32* (2006.01)
*G03B 27/52* (2006.01)
*G03B 27/42* (2006.01)

(52) U.S. Cl. .............................. 355/77; 355/55; 355/53
(58) Field of Classification Search ................. 355/77, 355/53, 55; 438/401; 382/144
See application file for complete search history.

(56) References Cited

U.S. PATENT DOCUMENTS 6,546,125 B1 *  4/2003  Su ............................. 382/144

2003/0003677 A1 *  1/2003  Fukada ....................... 438/401
2006/0139596 A1 *  6/2006  Edart .......................... 355/55

OTHER PUBLICATIONS

Roberts, B., et al., "Optimization and Characterization of the Blazed Phase Grating Focus Monitoring Technique", Infineon Technologies (11 pages), May 2004.

* cited by examiner

*Primary Examiner*—Peter B. Kim
(74) *Attorney, Agent, or Firm*—Houston Eliseeva LLP

(57) ABSTRACT

A method for automatically providing data for the focus monitoring of a lithographic exposure process is disclosed. Firstly, the file for a wafer is generated, which holds at least the information of the size of the wafer, the position of a plurality of measurement pattern, the order in which the measurement patterns are captured and registered, and the alignment of the measurement pattern. Secondly, this information is stored in a master grid. Thirdly, images are acquired of the pattern of each position stored in the master grid of the generated file, wherein the image acquisition is carried out according to the order as stored. Finally, names are assigned to the acquired images.

7 Claims, 18 Drawing Sheets

METHOD FOR AUTOMATICALLY PROVIDING DATA FOR THE FOCUS MONITORING OF A LITHOGRAPHIC PROCESS

FIELD OF THE INVENTION

The invention concerns a method for automatically providing data for the focus monitoring of a lithographic process.

BACKGROUND OF THE INVENTION

It is important to have a focus monitoring method which allows the reliable determination of the focus status of a lithographic process. The publication "Optimization and Characterization of the Blazed Phase Grating Focus Monitoring Technique" by Bill Roberts and Gerhard Kunkel; Infineon; discloses a method to increase focus resolution. The Blazed Phase Grating has been proven to be a suitable vehicle for on wafer aberration monitoring, but needs ex-situ correlations to determine the coefficient values. The phase grating method is introduced in production as a routine focus monitor. The accuracy of this method allows us to provide detailed analysis about the levelling capability and stability of all exposure tools. The testing is based on an optical microscope that can process more than 6000 data point per hour with very high accuracy. Beside the daily focus monitoring, which only takes five minutes, it allows fast full wafer analysis for chuck evaluation, wafer edge behaviour and other signatures that detract yield.

BRIEF SUMMARY OF THE INVENTION

It is the object of the present invention to create a fast, automated and reliable method for providing data for the focus monitoring of a lithographic exposure process.

This object is achieved by a method for automatically providing data for the focus monitoring of a lithographic exposure process comprising the steps of:

generating a file for a wafer, wherein the file holds at least the information of the size of the wafer, a position of a plurality of measurement pattern, the order in which the measurement patterns are captured and registered, and the alignment of the measurement pattern, storing the position of a plurality selected measurement pattern in a master grid, acquiring images of the pattern of each position stored in the master grid of the generated file, wherein the image acquisition is carried out according to the order as stored, and assigning names to the acquired images.

The file, which stores the plurality of selected measurement patterns in a master grid is a KLA-file.

The step of generating the file, KLA-file, comprises the step that an optical system is displaced to each position of a measurement pattern, and each position of the measurement pattern is stored to generate the master grid.

The step of generating the file has a setting, that each position of a single measurement pattern is detected by an inspection system wafer and the setting of the inspection system are so that the position of the measurement pattern is reported to the system which is indicated as a single defect, so that the position is registered only once.

The master grid contains order information and alignment information. The master grid is generated once and is used as an inspection recipe for all the wafers selected for inspection during a running lithographic exposure process. During the running lithographic exposure process a golden image is compared with an image from a measurement pattern, wherein the golden image and the image of the measurement pattern are identical in order and alignment.

The measurement pattern may be configured in a series of different shapes and forms.

BRIEF DESCRIPTION OF THE DRAWINGS

The invention will be described below by way of example and with reference to the appended Figures, from which further features, advantages, and objects to be achieved may be inferred. In the figures.

DETAILED DESCRIPTION OF THE INVENTION

Figure 1:
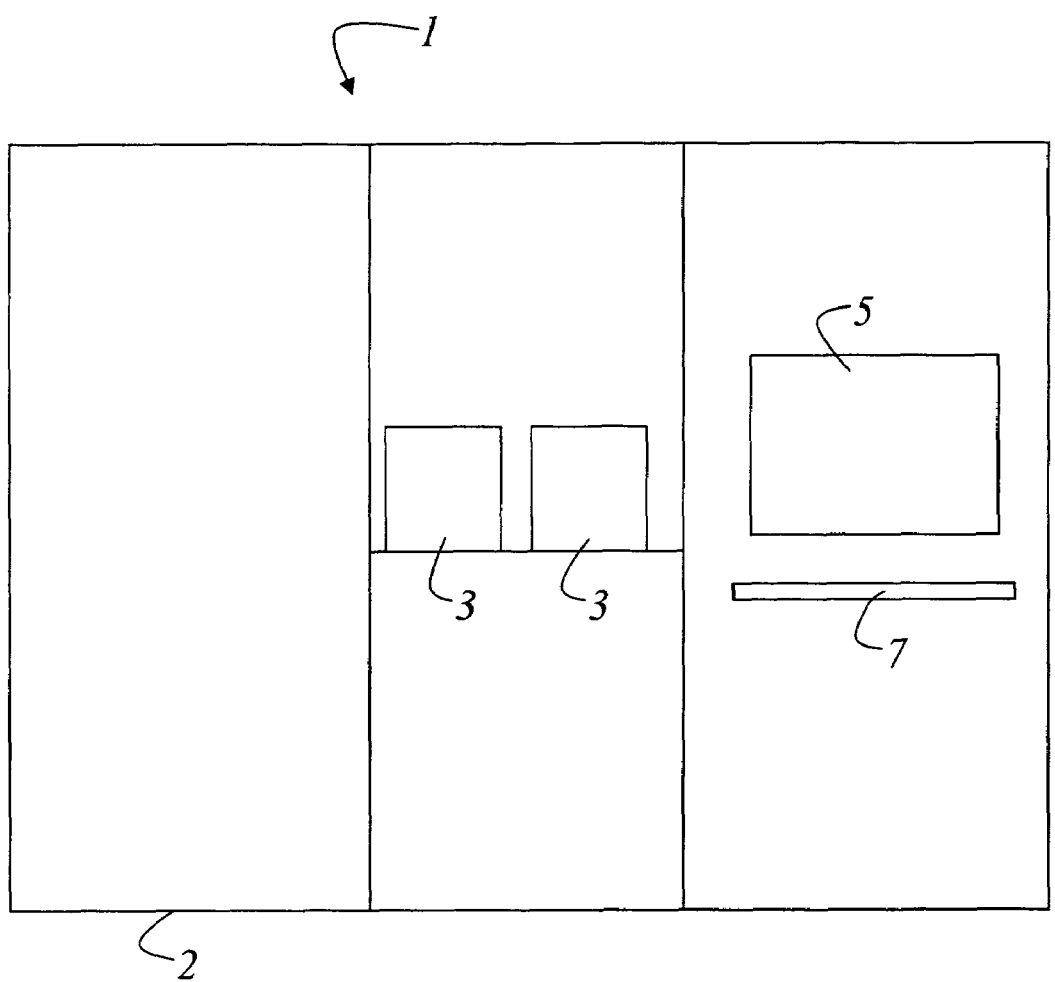
FIG. 1 is a schematic representation of a device which incorporates the inventive method.

FIG. 1 is a schematic representation of an inspection system 1 for semiconductor substrates, especially wafers. According to the embodiment shown here the inspection system 1 incorporates the ability to do macro- and micro-inspection of the wafers. In the present case the wafers are delivered in specialized containers 3 from a lithographic exposure process to the inspection system 1. The inspection of the wafers is carried out in an encased housing 2. At least one display 5 is provided at the encased housing. In addition to the display 5 a keyboard 7 is provided as well. Via the keyboard the user can carry out the inputs in order to set up the various inspection processes which can be preformed with the inspection system 1. Additionally the user can design special recipes for the inspection.

Figure 2:
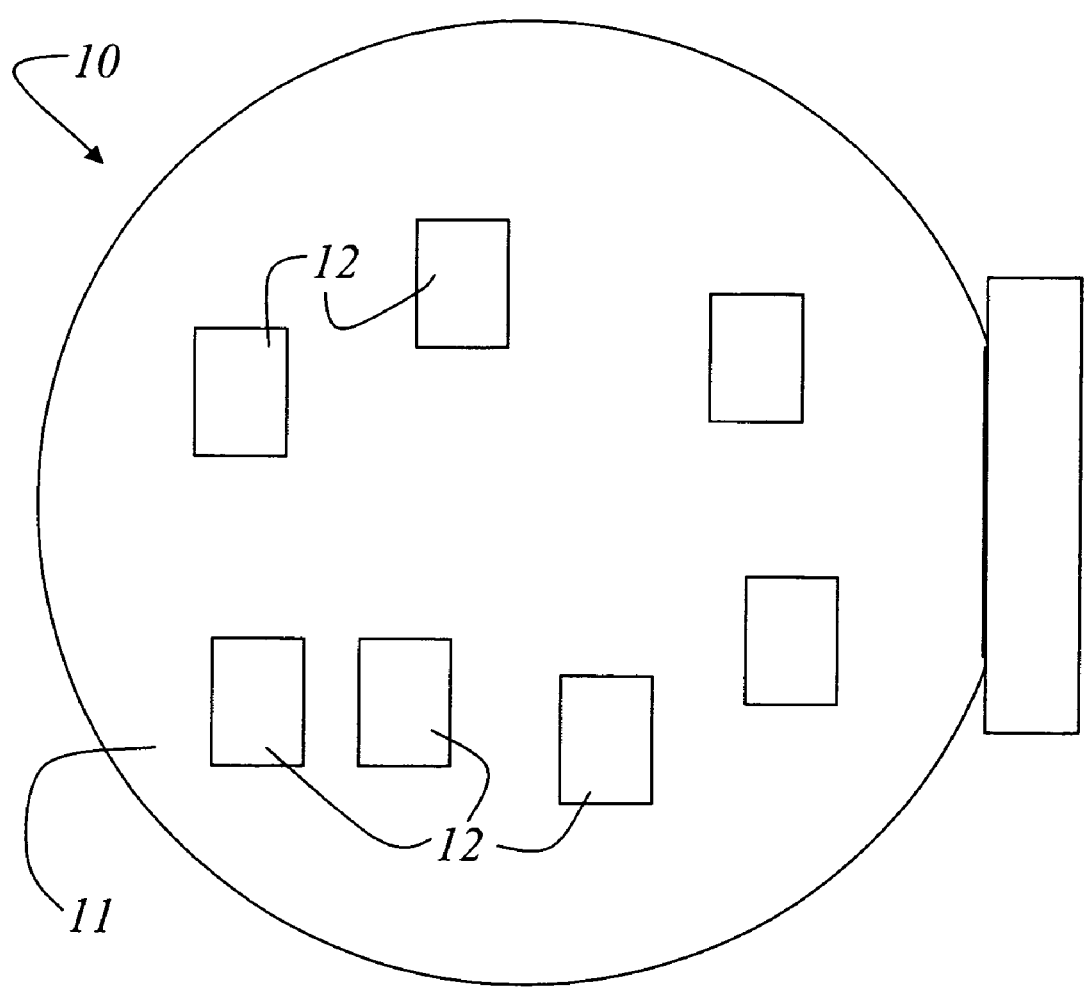
FIG. 2 is a schematic top view of a wafer which has a plurality of fields distributed on the surface, wherein each field has a plurality of patterns used to for the calculation of the focus of a lithographic process.

FIG. 2 shows a schematic top view of a wafer 10 which has a plurality of fields 12 distributed on its surface 11, wherein each field 12 has a plurality of patterns used to for the calculation of the focus of a lithographic exposure process. The measurement pattern in each field is inspected and known algorithms are uses to determine the focus quality of the lithographic exposure process.

Figure 3A:
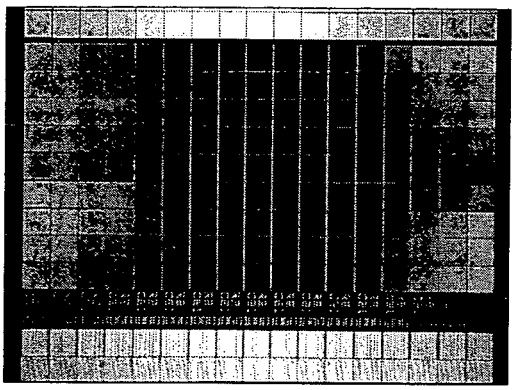
FIG. 3a is a first embodiment of a pattern used for the calculation of the focus of a lithographic process.

FIG. 3*a* shows a first embodiment of a pattern used for the calculation of the focus of a lithographic process.

Figure 3B:
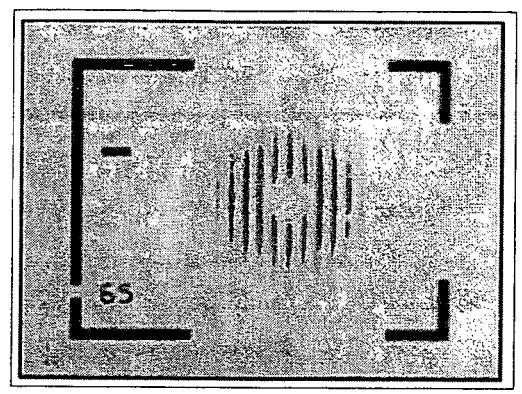
FIG. 3b is a second embodiment of a pattern used for the calculation of the focus of a lithographic process.

FIG. 3*b* shows a second embodiment of a pattern used for the calculation of the focus of a lithographic process.

Figure 3C:
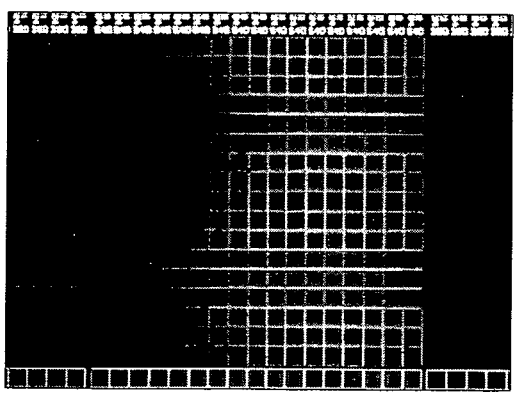
FIG. 3c is a third embodiment of a pattern used for the calculation of the focus of a lithographic process.

FIG. 3*c* shows a third embodiment of a pattern used for the calculation of the focus of a lithographic process.

Figure 3D:
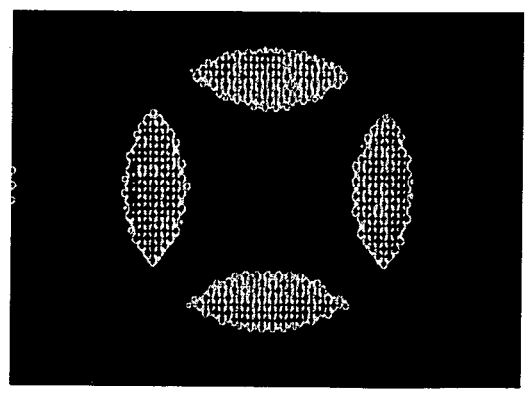
FIG. 3d is a forth embodiment of a pattern used for the calculation of the focus of a lithographic process.

FIG. 3*d* shows a forth embodiment of a pattern used for the calculation of the focus of a lithographic process.

Figure 4:
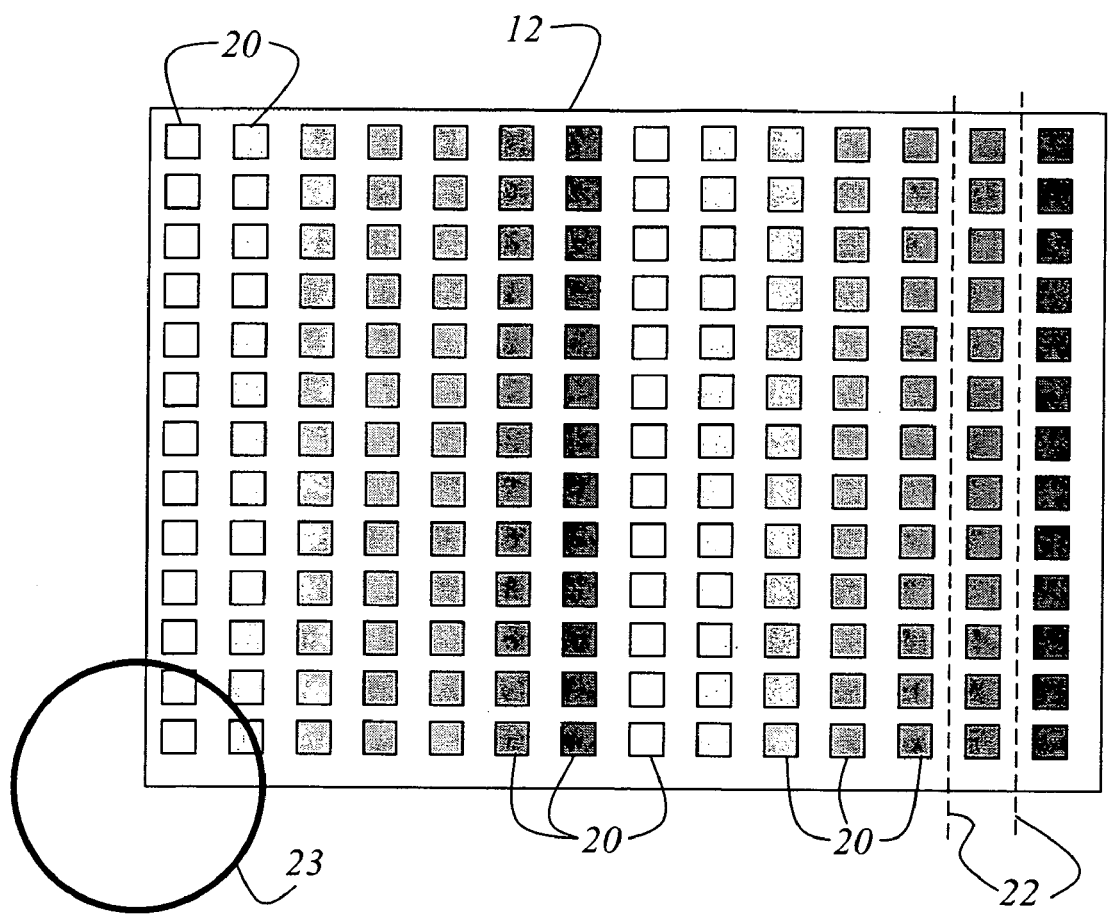
FIG. 4 is a schematic representation of one field with a plurality of patterns.

FIG. 4 is a schematic representation of one field 12 with a plurality of patterns 20.

The pattern is arranged in a plurality of rows 22, wherein the pattern shows at least a different exposure form row to row. A circle 23 in the lower left hand corner of the field 12 marks the start of the lithographic process in each field 12.

Figure 5:
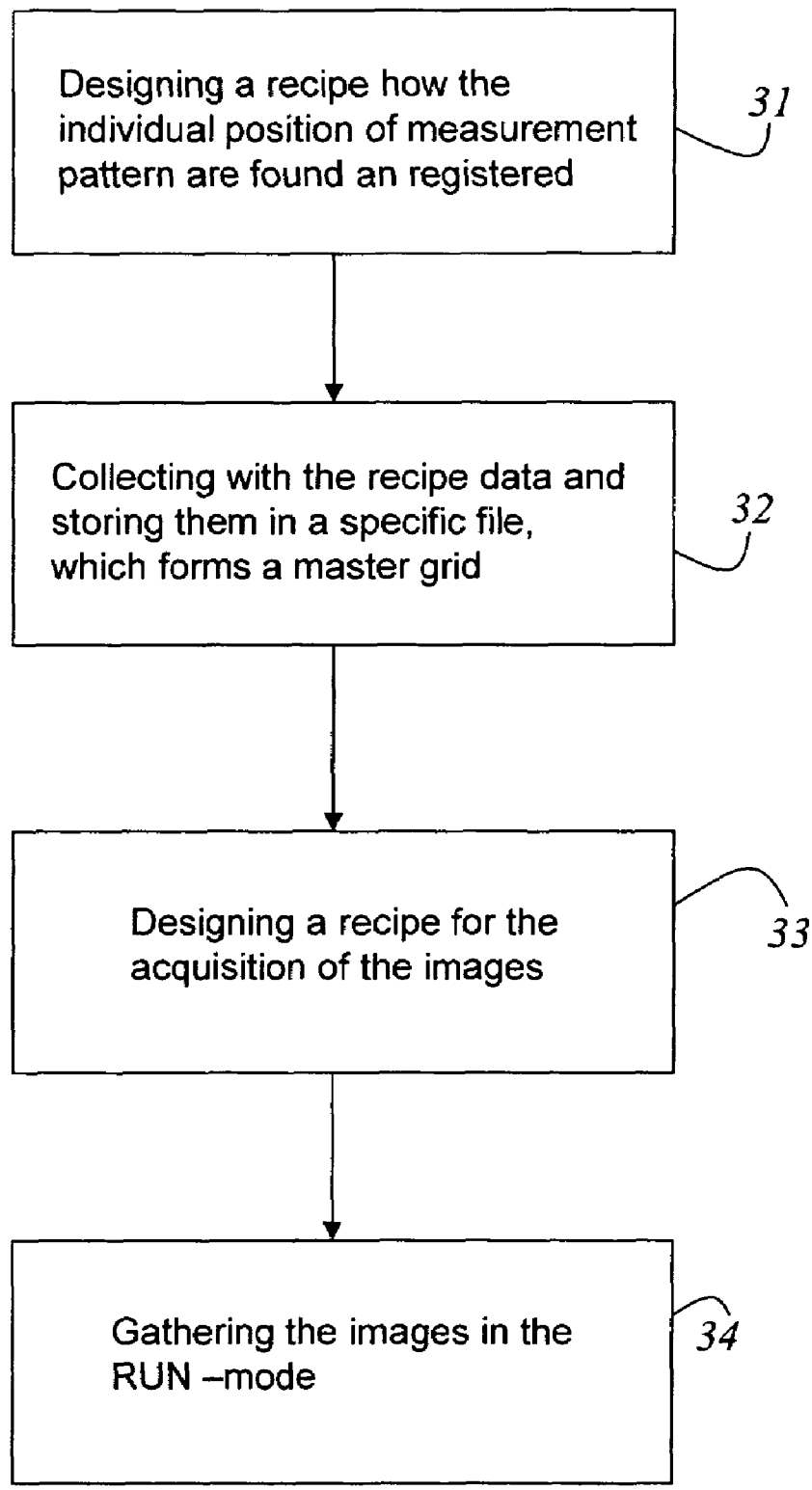
FIG. 5 is a schematic representation of the method to gather and provide data for the determination of the focus of a lithographic exposure process.

FIG. 5 shows a schematic representation of the method to gather and provide data for the determination of the focus of a lithographic exposure process. In a first step 31 a recipe has to be designed how the individual position of measurement pattern are found and registered. The recipe is a SpotCheck™ recipe. Then, in a second step 32, the data are collected with the recipe and stored in a specific file, which is a master grid. The file is a KLA-file. In a third step 33 a recipe for the acquisition of the images is designed. The images are of the various measurement pattern found in each position stored in the master grid of the KLA-file. In the forth step 34 the images are gathered in the RUN-mode. As mentioned above the images arc collected in the same order as they are stored in the KLA-file.

Figure 6:
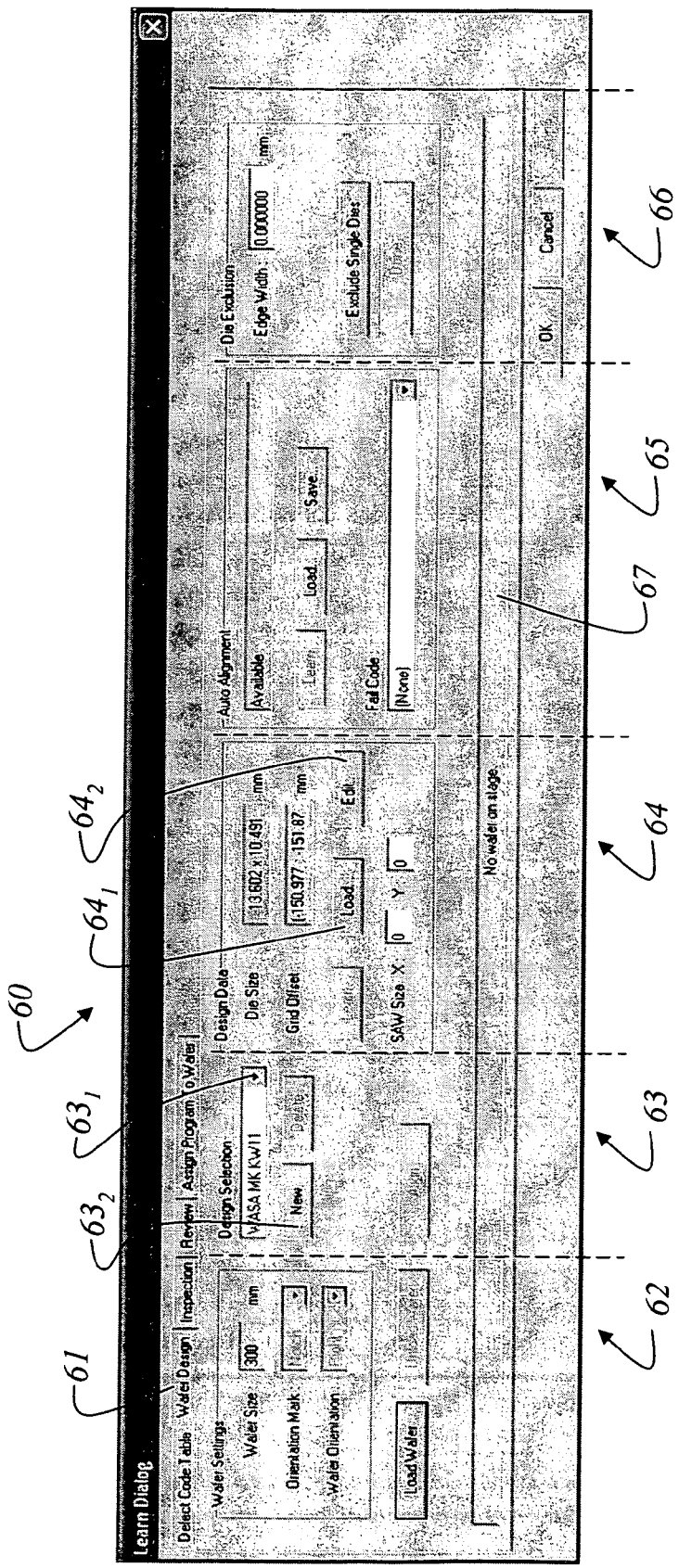
FIG. 6 is a learning recipe for the of the inspection system for the wafer design.

FIG. 6 is a learning recipe 60 of the inspection system 1 for the water design. The learning recipe 60 is shown to the user on the display 5 of the inspection system 1. On the display 5 an index 61 named "Wafer design" is high lighted or activated. In a first section 62 of the learn recipe the wafer settings can be selected or input. An input for example is the size of the wafer. In the case shown here the wafer size is 300 mm. In a second section 63 a design selection (wafer design) can be carried out. The user can select the relevant wafer design from a drop down box 63₁. Additionally, the user can add to the drop down list new wafer design with a "NEW" button 63₂ as well. In a third section 64, design data are provided. The design data are for example the die size on the wafer, the grid offset and the SAW size in the X and the Y direction. With a "LOAD" button 64₁ the user can load the data for the wafer under inspection. With the "Edit" button 64₂ the user can alter of input the data. In a forth section 65 the settings for the "Auto Alignment" can be set. In a fifth section 66 various dies may be excluded form the inspection process. Additionally, indication box 67 is provided which, indicates the presence or the absence of a wafer on the stage (not shown) of the inspection system.

Figure 7:
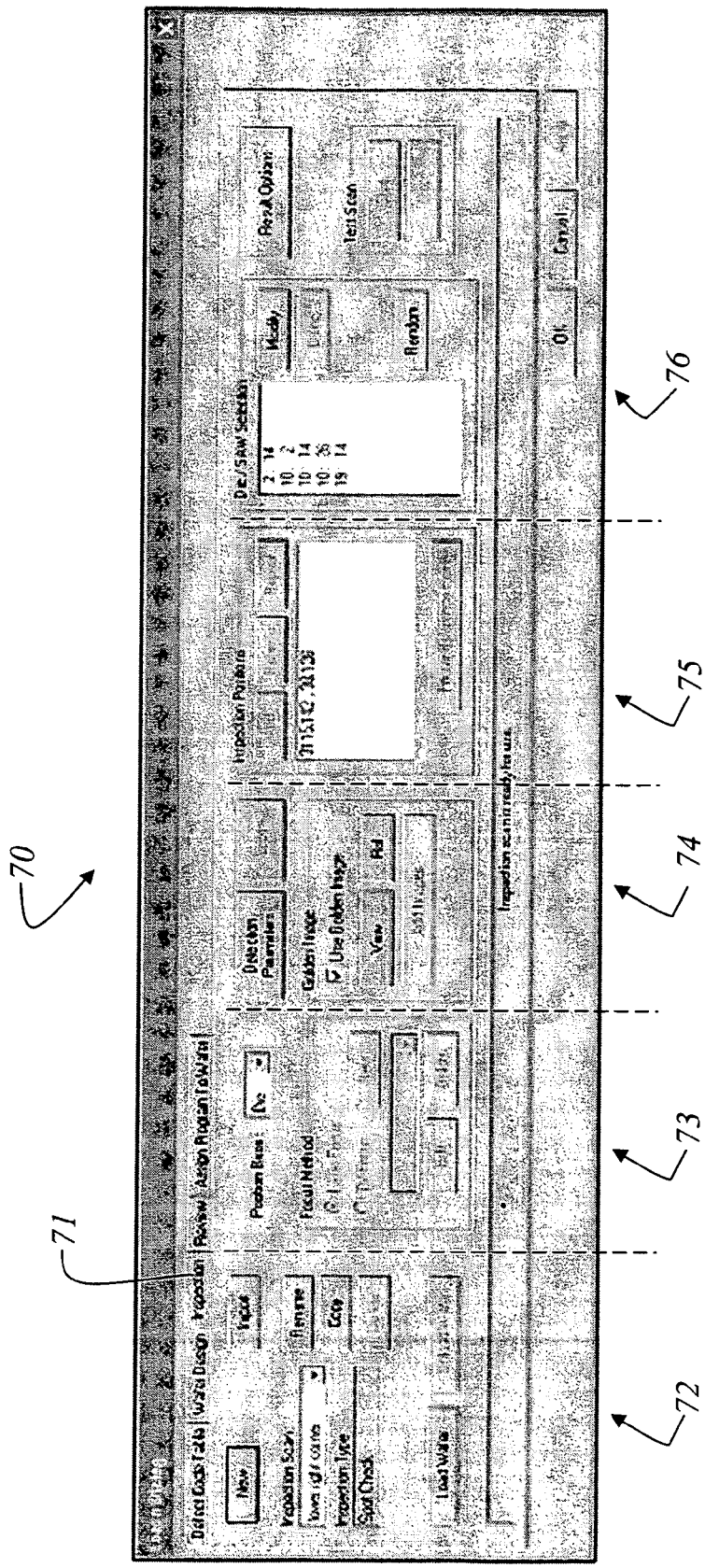
FIG. 7 is a learning recipe of the inspection system for the generation of the master grid; SpotCheck™.

FIG. 7 is a learning recipe 70 of the inspection system 1 for the generation of the master grid; SpotCheck™. On the display 5 an index 71 named "Inspection" is high lighted or activated. In a first section 72, named "NEW" the user can select the "inspection Scan" and the "Inspection Type". In a second section 73 the user can select the "Position Base" and the "Focus Mode". In a third section 74 the user can select the "Detection Parameters". Additionally, the use of the "Golden Image" is selected as well. In a forth section 75 the user is informed about the actual inspection position. In a fifth section 76, the user is informed about the "Die/Saw Selection". Additionally, indication box 77 is provided which, indicates that the inspection scan is ready for use.

Figure 8:
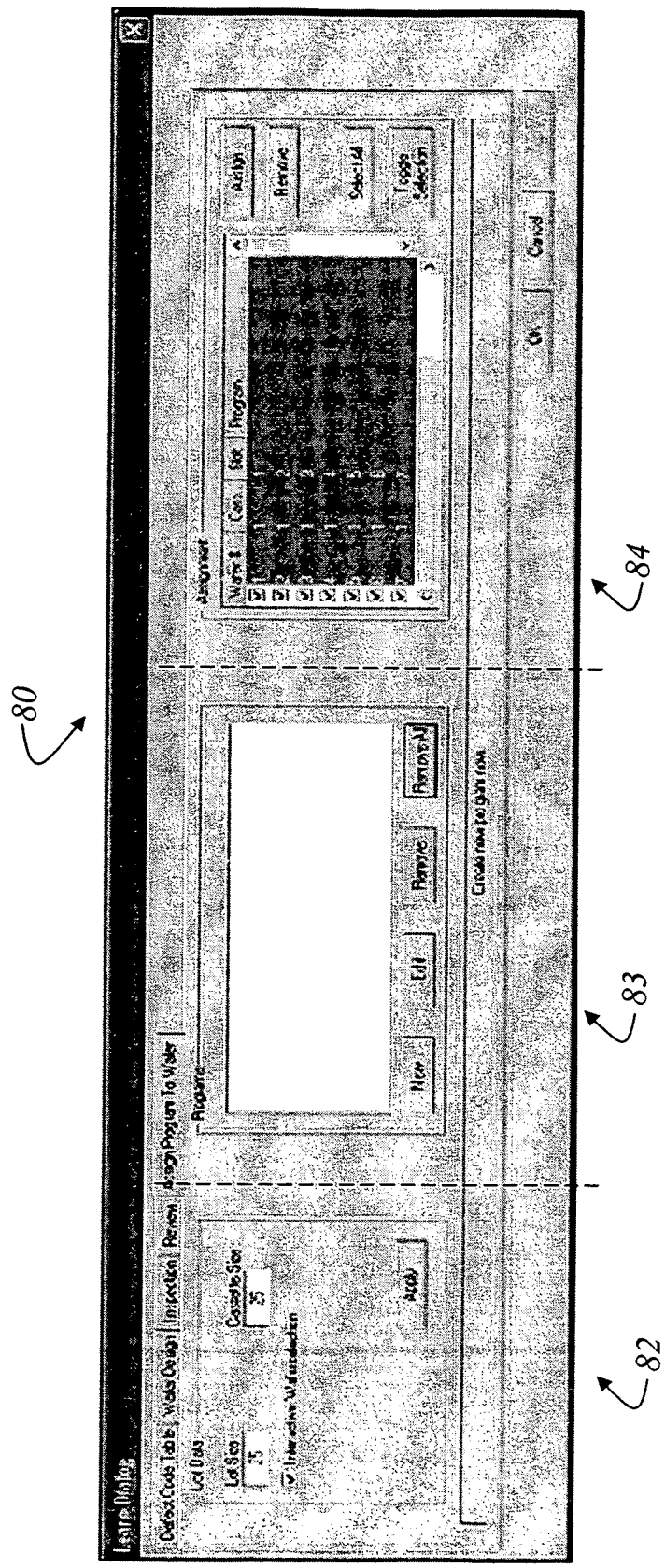
FIG. 8 is a learning recipe for the of the inspection system for the assignment of a special inspection program to the wafer.

FIG. 8 is a learning recipe of the 80 inspection system for the assignment of a special inspection program to the wafer. On the display 5 an index 81 named "Assign Program To Wafer" is high lighted or activated. In a first section 82, named "Lot Data" the user can input the lot size and the cassette size. In a second section 83, the user has a display field 83₁ for a program. In a third section 84 the user is informed about the assignment of the wafer to the cassette number and to the slot number in the cassette. Additionally, indication box 85 is provided which, indicates that the system is ready for the creation of a new inspection program.

The learn mode or the learning recipes 60, 70 and 80 can be started by the user via the display 5 and/or the keyboard 7.

Figure 9:
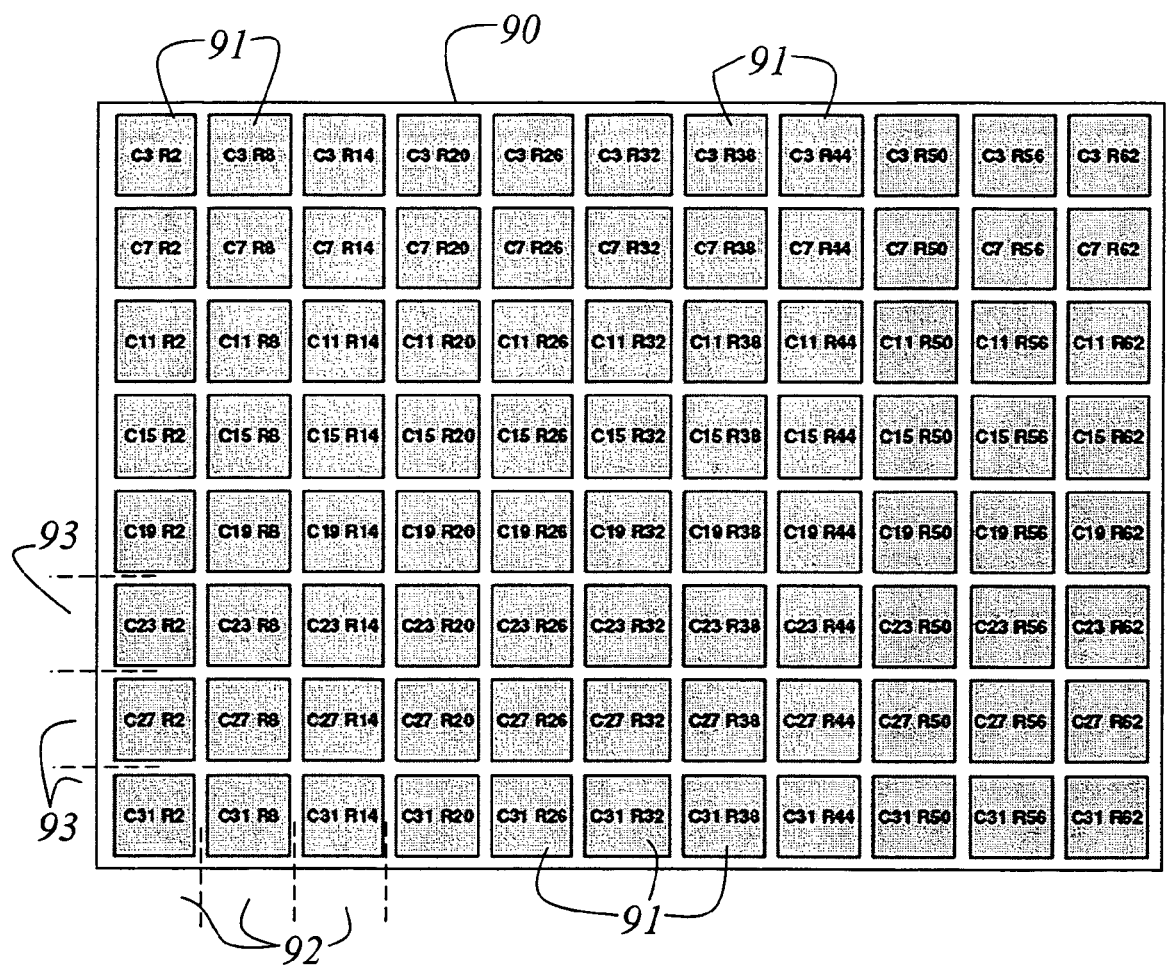
FIG. 9 is a schematic representation of a master grid.

FIG. 9 is a schematic representation of a master grid 90. A plurality of positions 91 is stored as the master grid. Each position has a defined position in a column 92 and a row 93. The lower left corner of the master grid 90 is designated with "C1R31". This means that the position is in the first column 91 and 31st row.

Via the display 9 the user can open or create a new program (a recipe for the investigation of a wafer) from scratch. Additionally, the user can open an existing program for editing. In case the user selects the option "Open As" a copy of an already existing program is created for editing. The existing program acts as template.

As already mentioned in the description of FIG. 6, the user selects at first the wafer size, the wafer orientation mark and the wafer orientation. The orientation mark may be configured as a flat 14 (see FIG. 6) or as a notch (not shown). The wafer for investigation is loaded form the containers 3. According to the type of the wafer the user creates or selects a wafer design. With respect to the new wafer design a new wafer grid or new master grid has to be learned. The edge and/or DIEs are excluded. The system 1 has to learn an auto alignment and a special failure code is selected, to make the system to register the each found position of a measurement pattern on the wafer.

According to the present embodiment, for the creation of the wafer design the structure in Row R30 and Column C15 is used. Since the measurement pattern is not a typical DIE, one must concentrate on the column and the Row's and use that as a lower left corner (see FIG. 5).

As mentioned above the master grid is established with a special program. According to one embodiment of the invention a program called SpotCheck™ is used. First of all the user has to create or select a SpotCheck Scan™. In addition to that the user has to select a SpotCheck™ type and a focus type. Then the detection parameters are setup. The Golden Image is learned and the scan positions are selected. Additionally, the DIEs for the SpotCheck™ inspection are selected. A setup of the result options is carried out as well. Finally the SpotCheck Scan™ is tested. Typical detection parameters for the "Image Alignment" is the maximum image shift in the X-direction and the maximum image shift in the Y-direction. Typical detection parameters for the "Image Filters" is the maximum normalization and the grain size. Typical detection parameters for the "Detection" is the sensitivity. Typical detection parameters for the "Defect Filters" is the minimum density, density window size, defect connecting, minimum defect size. Typical settings for the maximum image shift in the X-direction and the maximum image shift in the Y-direction is 5870,41 µm, for the maximum normalization is 255, for the grain size is 0, for the sensitivity is 55%, for the minimum density 0%, for the density window size is 9,39 µm, for the defect connecting is 0 µm and for the minimum defect size is 0,50 µm.

The "Golden Image" is very unusual for these recipe, because it has not an area of interest, in which a defect is expected. The golden image is only for the alignment of the position of the measurement pattern. Therefore, the "Golden image is used with a bright edge in dark field. The scan implements all the positions of measurement pattern which available later to capture images in an ADR recipe.

The scan result option displays various settings, which are very important. In combination with the "Golden Image" a defect will be detected only one time at each Inspection position, because the "Golden Image" shows no area of interest and here the focus is directed to the detection of the position of the various measurement pattern once.

With the function "assign program to Wafer" it is possible to bring all the fields (measurement pattern) on the wafer in a defined order. The defined order is very important for the analysis later. In order to use a KLA-file to automatically provide data for the focus monitoring of a lithographic process, the modification in the KLA-file is very important. First of all the ID of the inspection system 1 has to be modified. The second step is to load the wafer, align the wafer and adjust the "Adjust Origin" to the right field.

Figure 10:
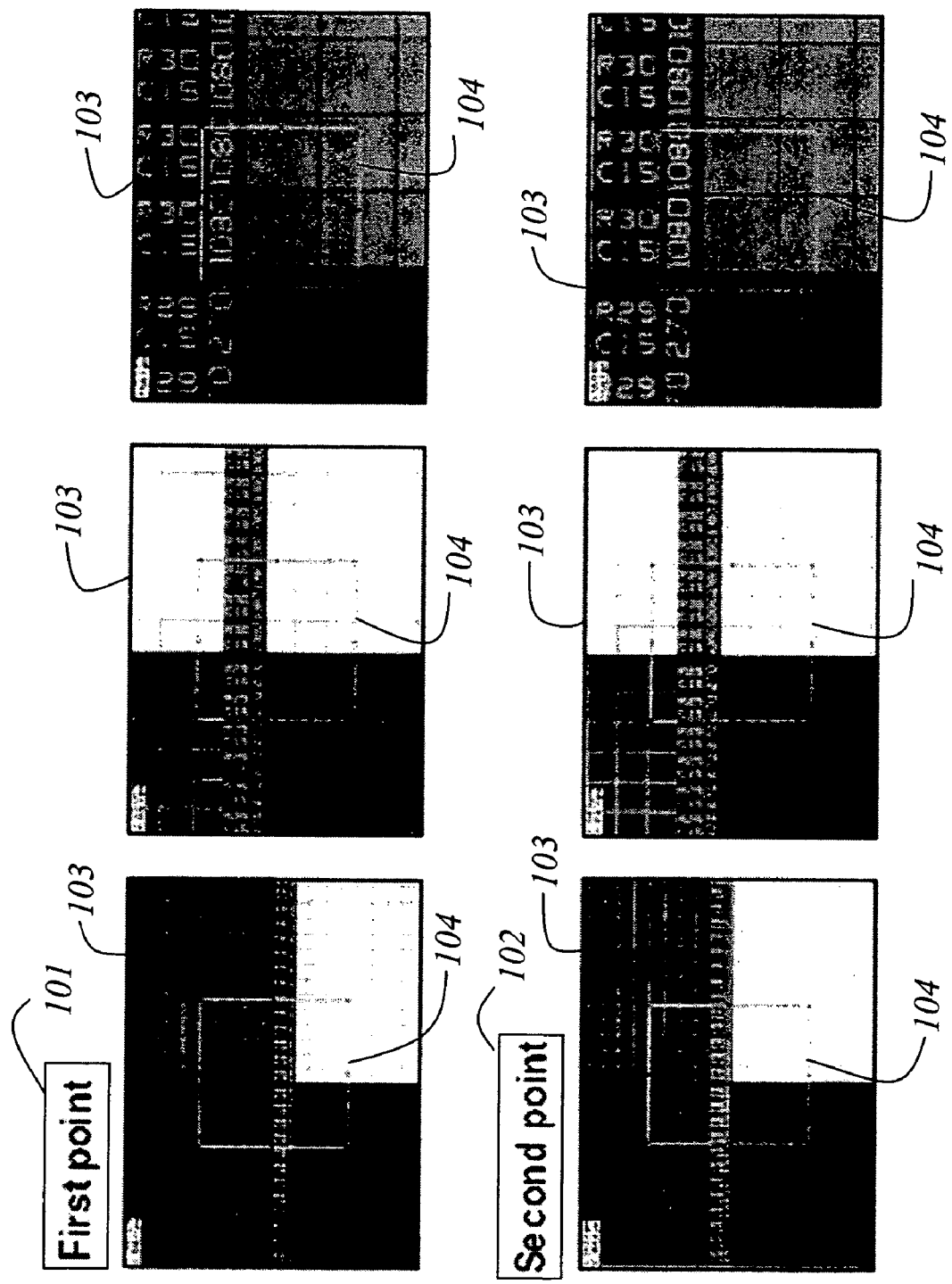
FIG. 10 is a representation of the images used for a two point "Auto Alignment"

After the modification of the "Adjust Origin" the wafer remains on the stage and some review points are checked. All of the structure or the measurement pattern should be in the field of view. If everything is okay the learn dialog for the "Auto Alignment" is started. For the "Auto Alignment" a two point "Auto Alignment" with three dark field images for each point is carried out (see FIG. 10). At a first point 101 three different images 103 are used for the "Auto Alignment". At a second point 102 the three images 103 are used for the "Auto Alignment". A frame 104 on each image 103 marks the area with which the alignment is carried out.

Figure 11:
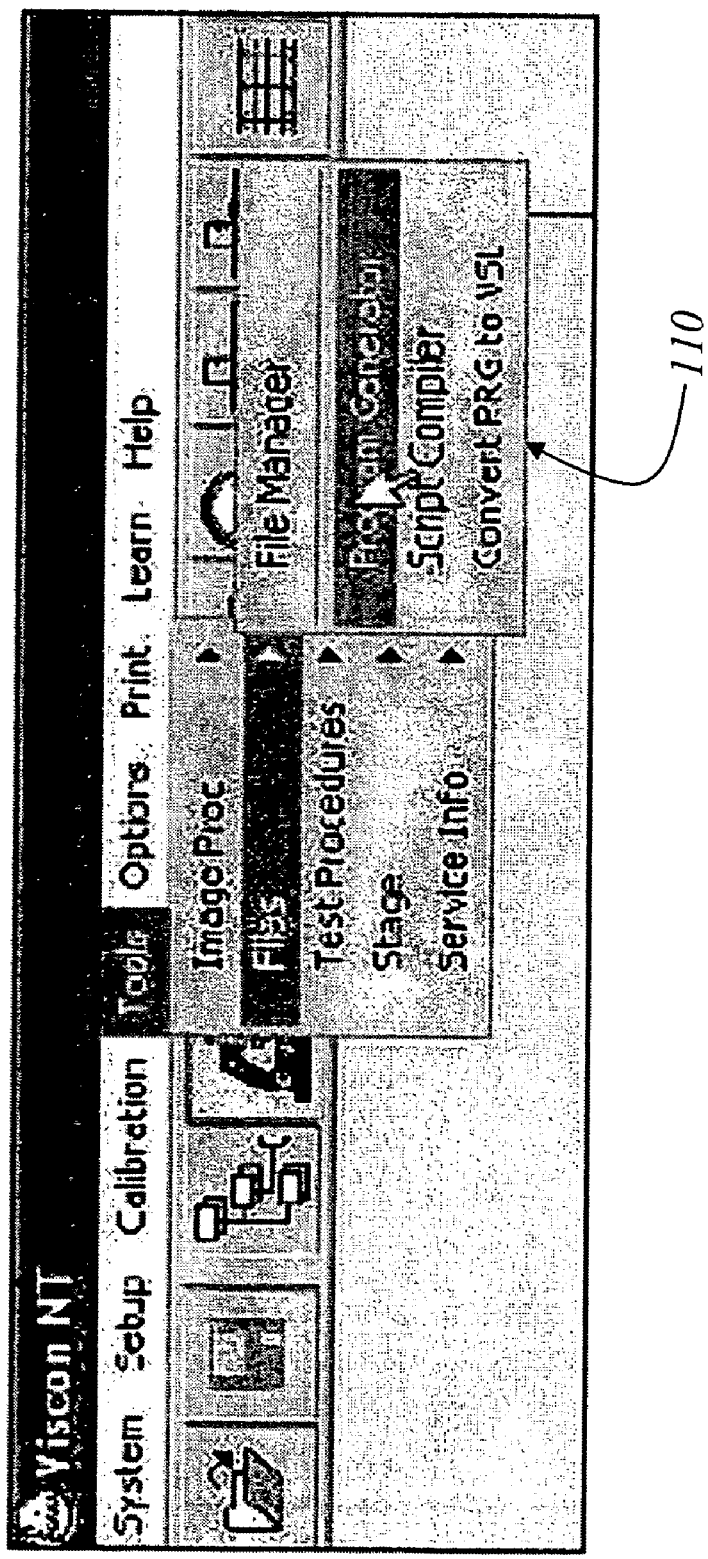
FIG. 11 is the path which needs to be opened on the display in order to call the VPG Dialog.

FIG. 11 shows the path 110 which needs to be opened on the display 5 in order to call the VPG Dialog. VPG stands for VISCON™ Program Generator. With VPG the user has to learn the ADR Recipe. ADR stands for Automatic Defect Review.

Figure 12:
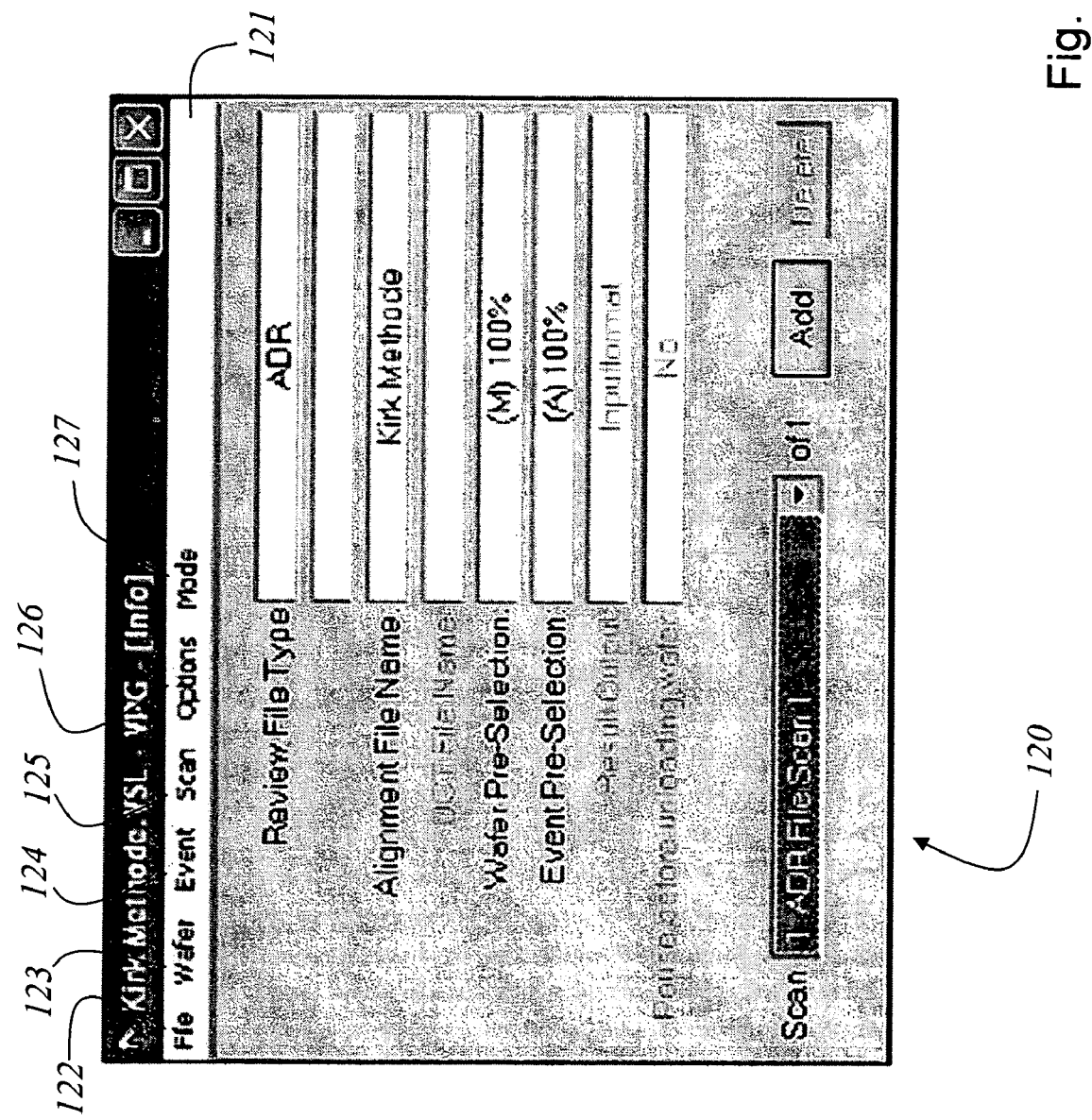
FIG. 12 is the VPG Dialog which is shown to the user on the display.

FIG. 12 is the VPG Dialog 120 which is shown to the user on the display. In a bar 121 at the top of the VPG Dialog 120 which displays from left to right several expressions need to be setup for the design of the recipe. The first expression is "File" 122, the second expression is "Wafer" 123, the third expression is "Event" 124, the forth expression is "Scan" 125, the fifth expression is "Options" 126 and the forth expression is "Mode" 127.

Figure 13:
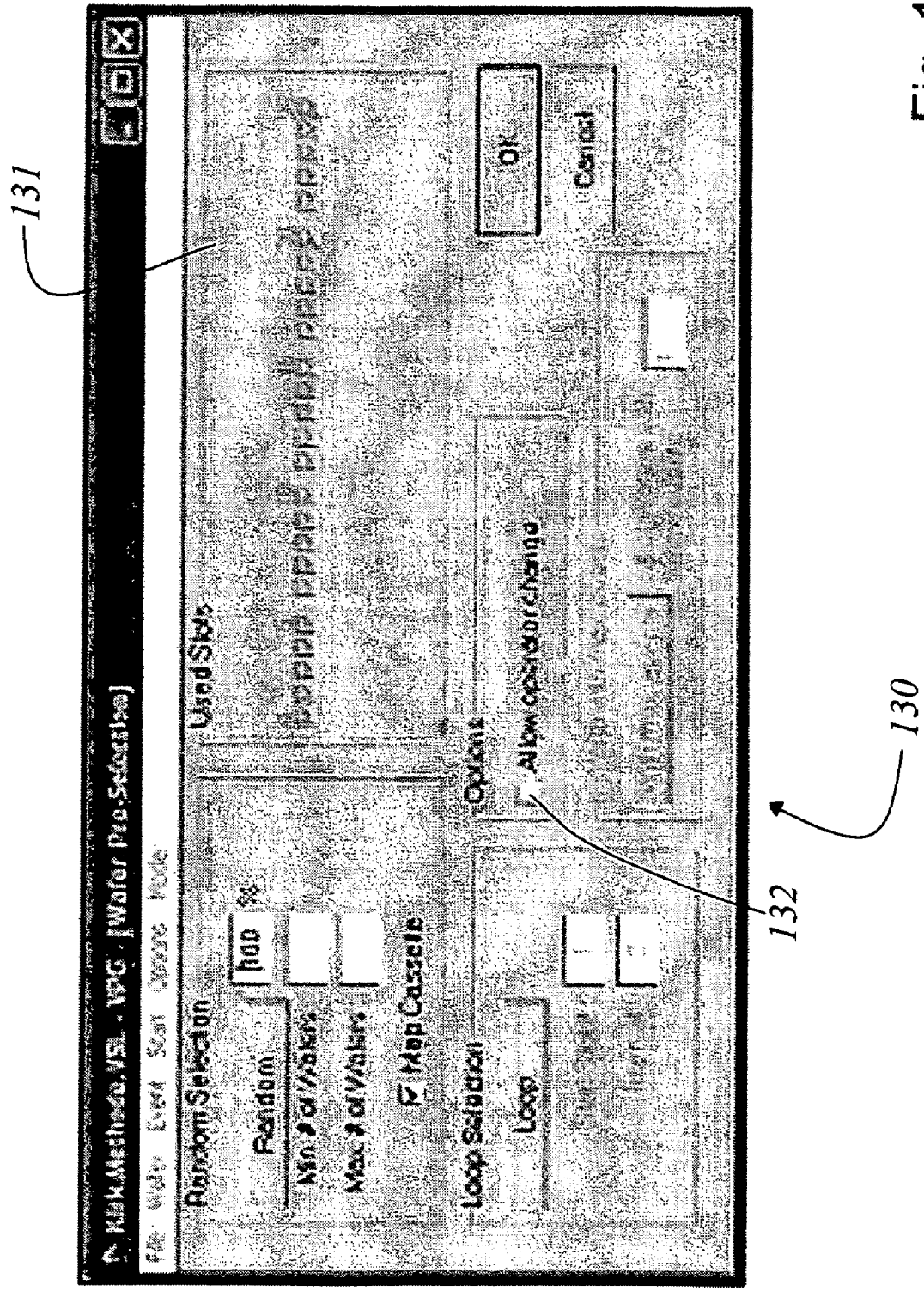
FIG. 13 is a Wafer Pre-Selection Dialog.

FIG. 13 shows a Wafer Pre-Selection Dialog 130 which allows the user to select the wafer, which are in a container and must be inspected by the inspection system. A box 131 in the Wafer Pre-Selection Dialog 130 allows the user to select the wafer from a lot which are subjected to inspection. Additionally, the user should not mark a box 132 named "Allow operator change".

Figure 14:
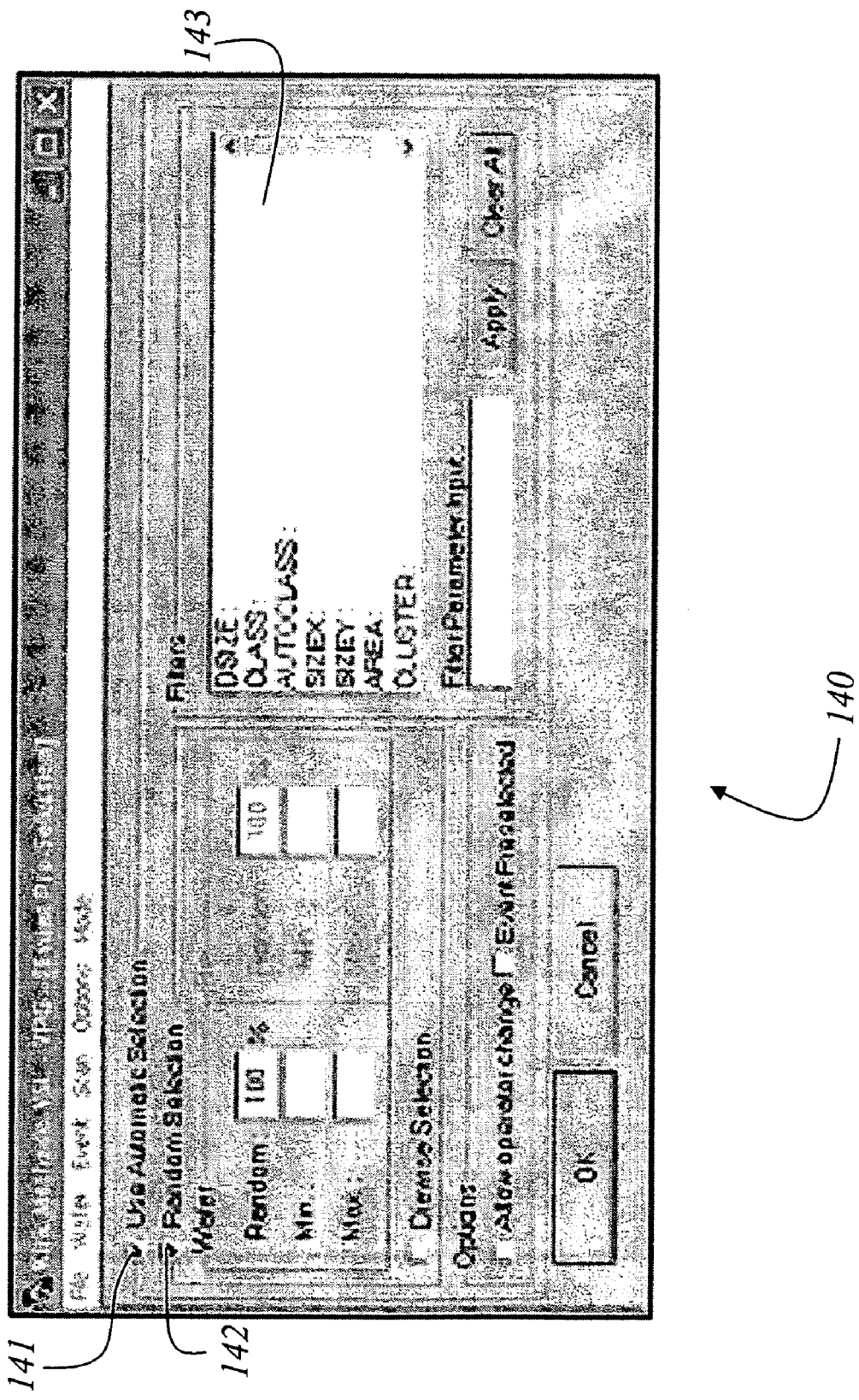
FIG. 14 is an Event Pre-Selection Dialog.

FIG. 14 is an Event Pre-Selection Dialog 140. The indication box 141 for "Use Automatic Selection" is marked. Furthermore, the indication box 142 "Random Selection" is marked as well and the random value for the wafers and the dies is set at 100%. A list of selectable filters is displayed in a window 143 with a designation "Filters".

Figure 15:
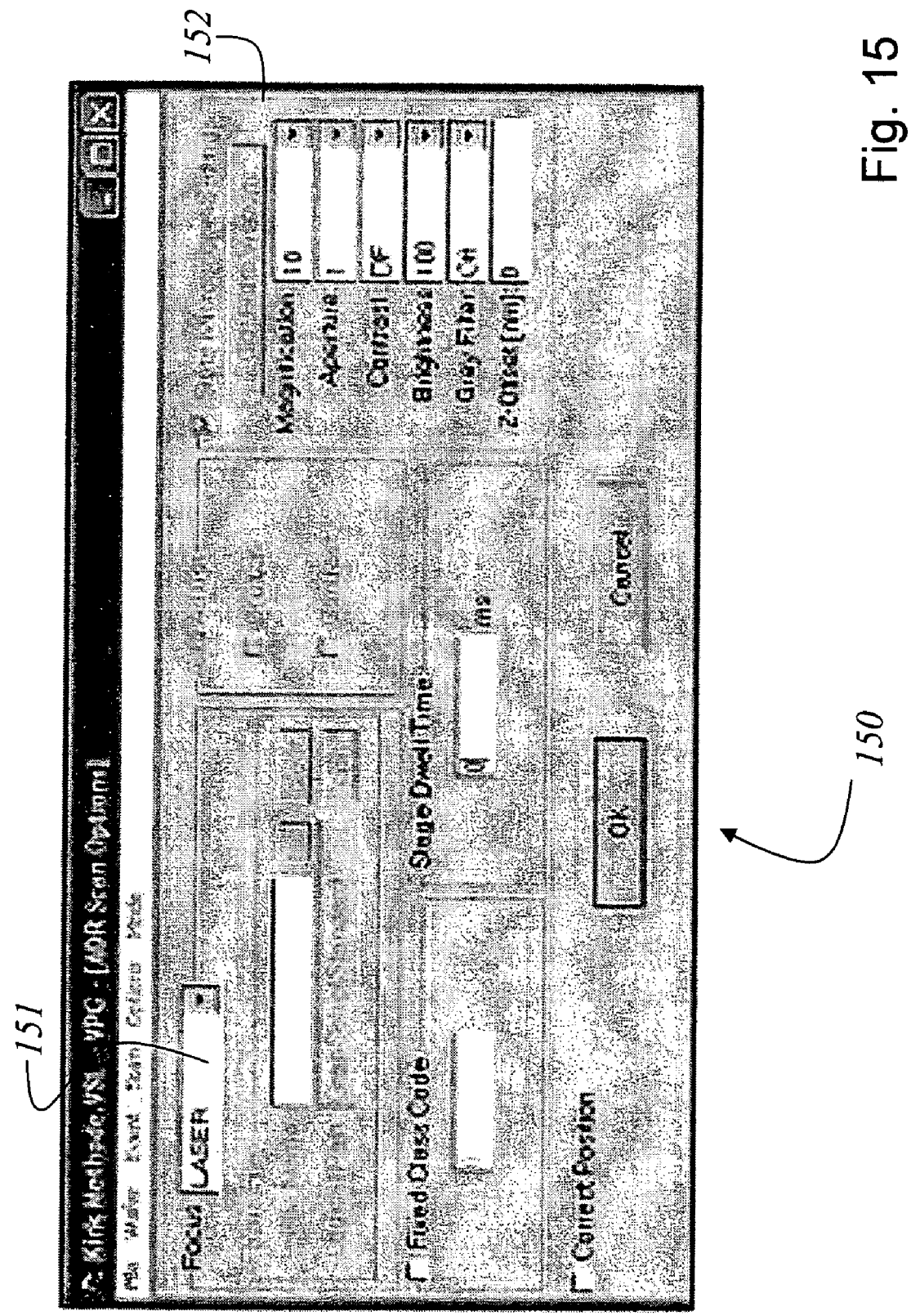
FIG. 15 is a dialog for setting up the Scan Options.

FIG. 15 is a dialog for setting up the Scan Options 150. With the dialog 150 the user selects the light source for the illumination. In the present dialog 150 a laser is selected by a drop-down box 151. Additionally, a window 152 is displayed with which the user can store the microscope settings. The microscope settings are for example; magnification, aperture, contrast, brightness, grey filter and Z-offset.

Figure 16:
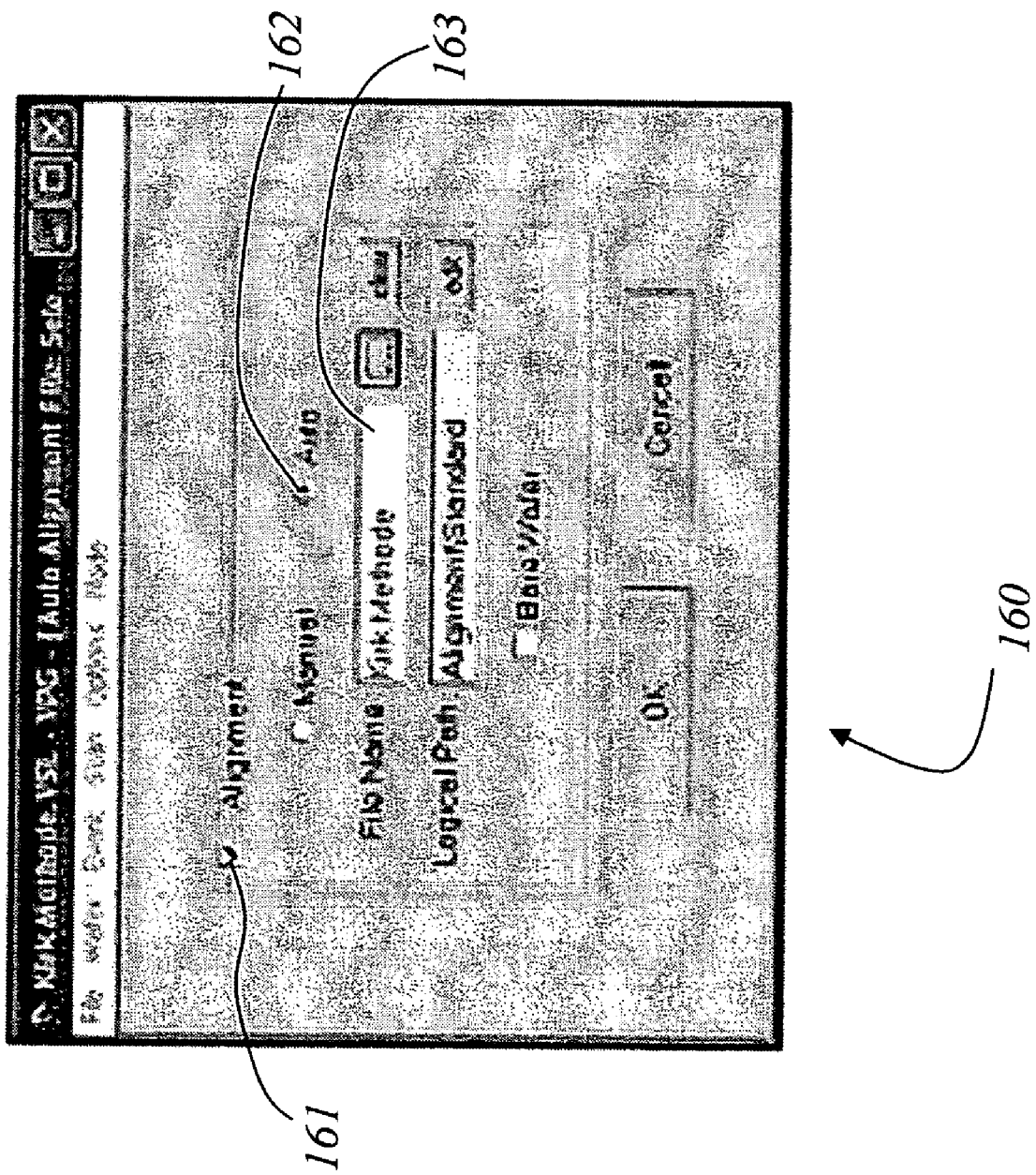
FIG. 16 is a dialog for setting up the Alignment Options.

FIG. 16 is a dialog for setting up the Alignment Options 160. In an alignment window 161 an "Auto-Mode" 162 is set. Additionally, the user selects a special program for the alignment with a drop-down box 163.

Figure 17:
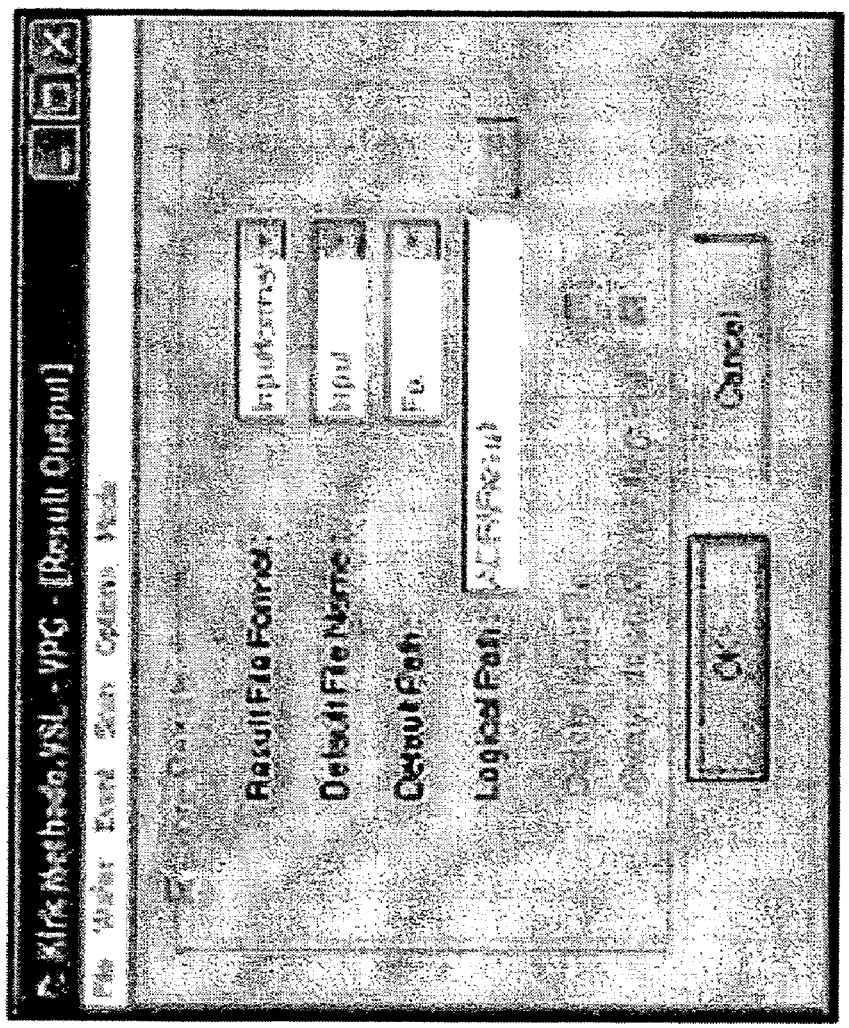
FIG. 17 is a dialog for setting up the Result Options.

FIG. 17 is a dialog for setting up the Result Options 170. The user has several drop-down boxes 171 available and the user can select various options for storing the results.

Figure 18:
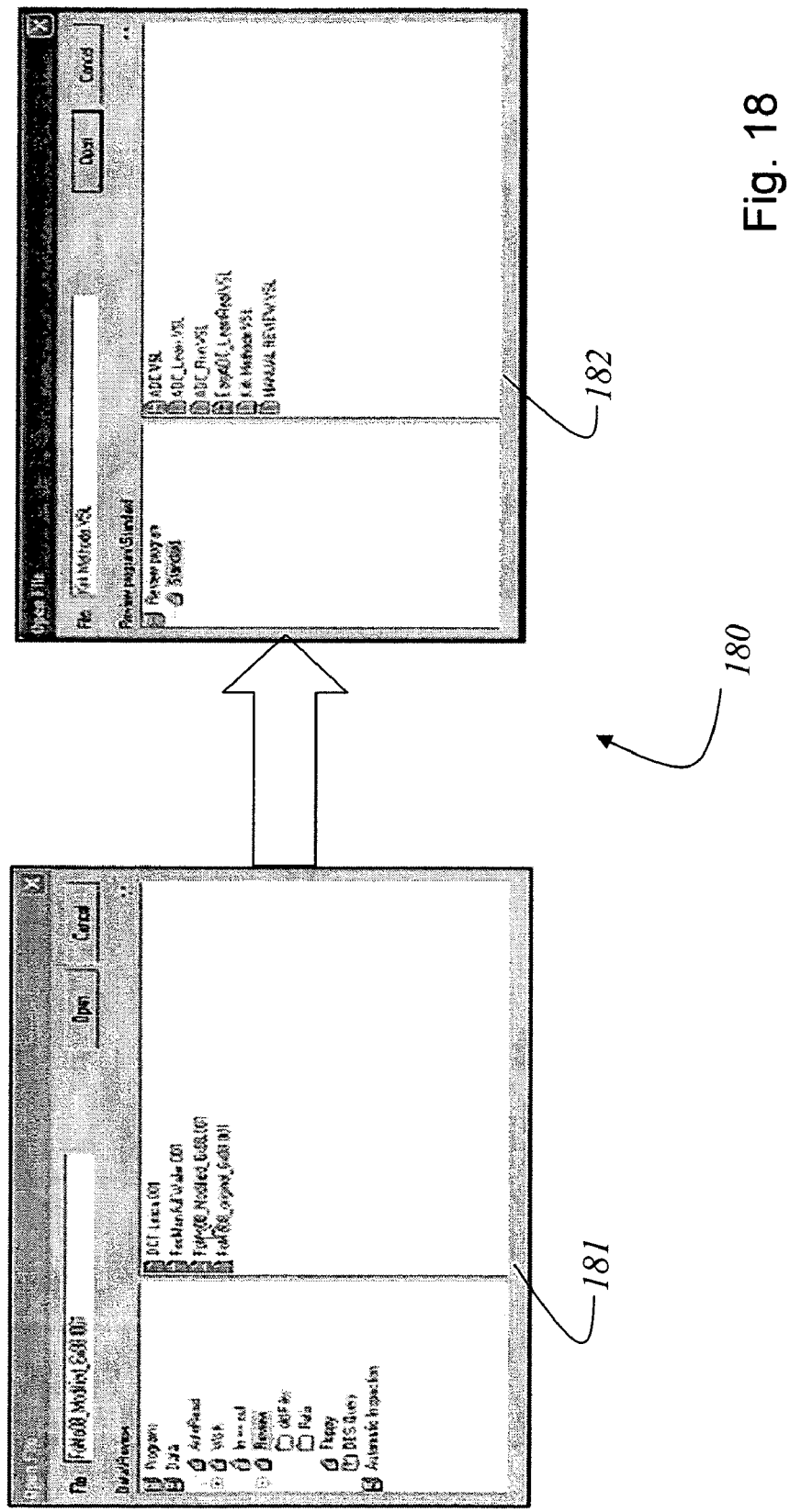
FIG. 18 is a representation of the file structure of a plurality of KLA-files and a plurality of measurement recipes which the user can select for carrying out the focus monitor.

FIG. 18 is a representation of the file structure of a plurality of KLA-files and a plurality of measurement recipes which the user can select for carrying out the focus monitor. Before starting the determination of the data for the focus monitor the user has to select right KLA-file 181. After the selection of the desired KLA-file the user has to select the desired recipe 182 for the ADR Recipe.

The invention claimed is:

1. A method for monitoring a focus quality during a lithogaphic exposure process comprising the steps of:
   providing a wafer having a plurality of fields on its surface, each field having a plurality of measurement patterns;
   displacing an optical system to each position of the plurality of measurement patterns of a wafer to generate a file for the wafer, the file comprising information about a size of the wafer, a position of the plurality of measurement patterns, an order of registering and capturing of the plurality of measurement patterns, and their alignment;
   selecting a plurality of selected measurement patterns and storing the positions of the plurality of selected measurement patterns in a master grid of the file for the wafer;
   for each position stored in the master grid of the file for the wafer, acquiring images of the plurality of selected measurement patterns, according to the order; and
   monitoring the focus quality by comparing an image obtained at the acquiring step to a golden image.

2. The method as defined in claim 1, wherein the file is a KLA-file.

3. The method as defined in claim 1, wherein at the step of generating the file each position of a measurement pattern of the plurality of measurement patterns is detected by an inspection system having a setting that the position of the plurality of measurement patterns is reported to the inspection system and indicated as a single defect, so that the position is registered only once.

4. The method as defined in claim 1, wherein the master grid contains order information and alignment information.

5. The method as defined in claim 1, wherein the master grid is generated once and is used as an inspection recipe for all wafers selected for inspection during a running lithographic exposure process.

6. The method as defined in claim 5, wherein the golden image and the image are identical in order and alignment.

7. The method as defined in claim 1, wherein the plurality of measurement patterns have different shapes and forms.

* * * * *